United States Patent [19]

Znojkiewicz

[11] Patent Number: 4,571,564
[45] Date of Patent: Feb. 18, 1986

[54] APERTURE-COUPLED MICROWAVE APPARATUS

[75] Inventor: Maciej E. Znojkiewicz, Mount Royal, Canada

[73] Assignee: Northern Telecom Limited, Montreal, Canada

[21] Appl. No.: 532,543

[22] Filed: Sep. 15, 1983

[30] Foreign Application Priority Data

May 16, 1983 [CA] Canada .................................. 428268

[51] Int. Cl.⁴ .......................... H01P 5/00; H01P 7/06; H04B 1/26

[52] U.S. Cl. .................... 333/230; 333/246; 455/325; 455/330

[58] Field of Search ............... 455/323, 325, 330, 246; 333/230, 219, 222, 223, 227, 235; 331/96, 107 DP, 101 SL

[56] References Cited

U.S. PATENT DOCUMENTS

| | | | |
|---|---|---|---|
| 3,805,198 | 4/1974 | Gewartowski | 333/219 X |
| 4,211,987 | 7/1980 | Pan | 333/230 |
| 4,251,817 | 2/1981 | Kimura et al. | 333/250 X |
| 4,329,663 | 5/1982 | Bereskin | 331/96 |
| 4,361,820 | 11/1982 | Sagawa et al. | 333/222 X |
| 4,426,631 | 1/1984 | D'Avello et al. | 333/222 X |

FOREIGN PATENT DOCUMENTS

| | | | |
|---|---|---|---|
| 2734397 | 2/1978 | Fed. Rep. of Germany | 331/96 |
| 0012553 | 1/1979 | Japan | 331/107 SL |

Primary Examiner—Eugene R. LaRoche
Assistant Examiner—Benny Lee
Attorney, Agent, or Firm—Thomas Adams

[57] ABSTRACT

In a microwave device, for example a microwave local oscillator with a harmonic mixer for feedback control, problems of coupling the mixer circuit to the R.F. cavity are overcome by providing a d.c. blocking capacitor of the mixer on a planar surface of a support extending across an aperture in one wall of the cavity. In preferred embodiments the capacitor is a planar device formed by a plurality of interdigitated fingers. These fingers are oriented to couple magnetically with the R.F. energy at the aperture in the cavity. The support conveniently comprises a printed circuit board having a ground plane on the same surface as the capacitor, which is located in a small opening in the ground plane. A second ground plane is provided on the opposite side of the printed circuit board, overlying the opening. The two ground planes are interconnected by plate-through-holes.

5 Claims, 5 Drawing Figures

APERTURE-COUPLED MICROWAVE APPARATUS

The invention relates to microwave apparatus and is especially applicable to R.F. coupling with a tuned resonant cavity via an aperture.

Embodiments of the invention are especially applicable to microwave local oscillators having harmonic mixers. In high frequency systems, for example 4 GHz and more, extreme accuracy is difficult to achieve because of stability limitations of the local oscillator. At such frequencies crystal control is not practical so feedback control is usually used, with the feedback signal being derived from the R.F. signal by a harmonic mixer. In such systems, and in similar situations in other microwave apparatus, a problem arises in coupling the circuit components, for example the mixer diode, to the R.F. cavity.

One known arrangement has a pair of diodes, step recovery diode and mixer diode, inserted into an aperture communicating with the cavity. The diode leads exposed to the cavity are soldered together and serve as the coupling member. A disadvantage of this arrangement is that it is difficult to get the lengths of the leads right and generally awkward to assemble them. In another known device a single diode is protruded into the cavity as a probe. Difficulties here arise in soldering the diode to the cavity wall, resulting in dry joints or overheating of the diode, and again in adjusting the lead length.

In both cases, the configuration is not readily repeatable, which is a significant disadvantage.

According to the present invention there is provided: microwave apparatus comprising:
 a cavity;
 an aperture through one wall of the cavity;
 an insulating support extending across the aperture;
 a plurality of mutually spaced conductive fingers on the surface of the support which faces toward the cavity;
 a first ground plane on the same surface of the support, co-planar with, surrounding and insulated from the conductive fingers;
 and a second ground plane on the opposite surface of the support overlying the conductive fingers, where the conductive fingers can couple magnetically with radio frequency energy in the cavity.

Preferably, the ground planes are connected together by a plurality of plated-through holes on both sides of the region containing the fingers. The fingers may be connected to an electronic circuit so as to function as a capacitor in that circuit. In one embodiment, the fingers are connected to function both as a coupling element to magnetically couple radio frequency energy from the cavity to a mixer diode, and as a d.c. blocking capacitor connected between the mixer diode and a step recovery diode.

An embodiment of the invention will now be described, by way of example only, with reference to the accompanying drawings, in which.

Figure 1:
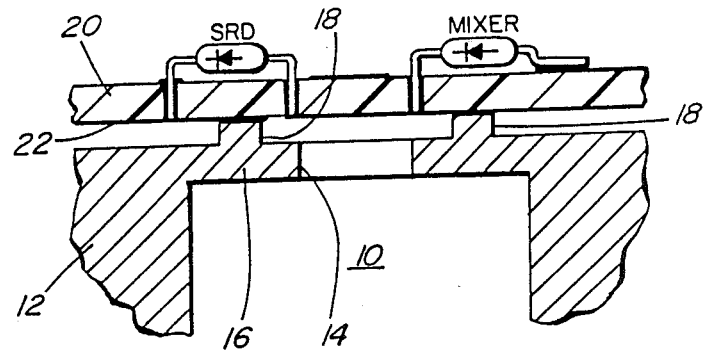
FIG. 1 is a cross-sectional side elevation of part of a microwave device embodying the invention.
Figure 4:
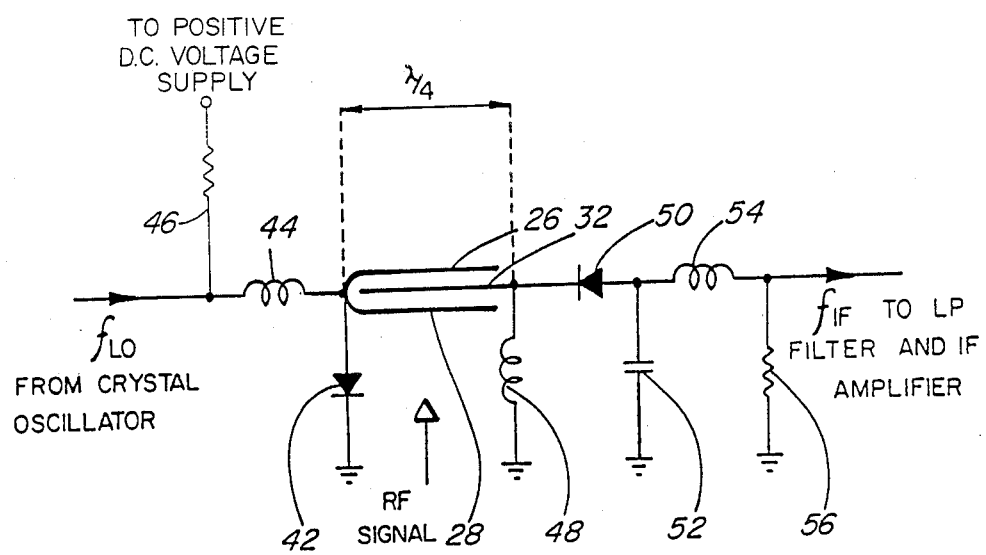
FIG. 4 is a schematic diagram of part of the circuit part of the microwave device.
Figure 2:
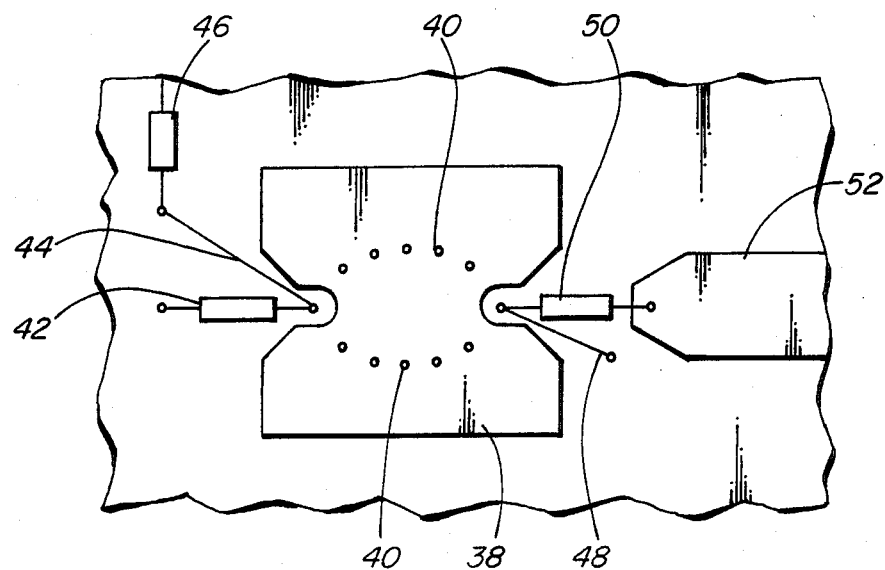
FIG. 2 is a plan view of a part of a printed circuit board which is part of the microwave device.
Figure 3:
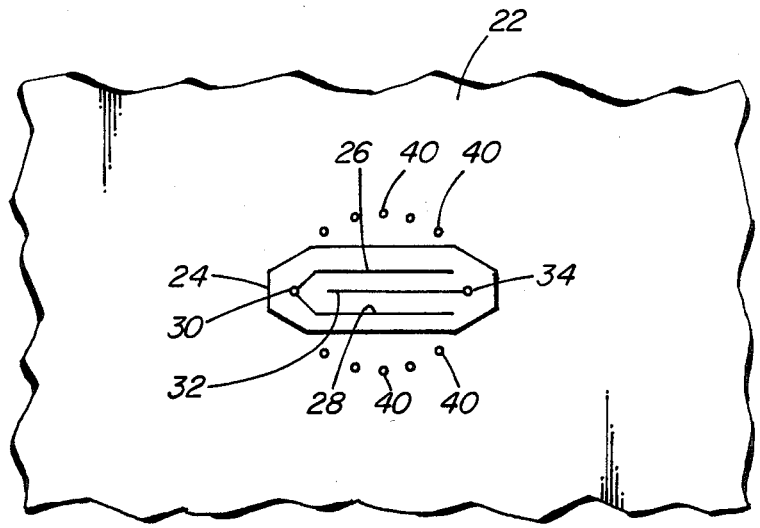
FIG. 3 is a view corresponding to FIG. 2 but from the opposite side of the board.

Referring to FIG. 1, a microwave device comprises a cavity 10, of parallelepiped shape, formed in an aluminum block 12. An aperture 14 extends through one wall 16 of the cavity 10, approximately centrally. A circular wall or boss 18 projects from the outer (i.e. remote from the cavity) surface of wall 16, surrounding the aperture 14. A printed circuit board 20, of glass epoxy, is mounted upon boss 18 so as to extend in a plane parallel to the wall 16. The part of the printed circuit board 20 overlying the aperture 14 is shown in FIGS. 2 and 3. The electrical configuration of the various components it carries is shown in FIG. 4. Referring to FIG. 3, the underside of the board 20 is almost completely covered by a copper ground plane 22, with the exception of an oblong area 24 opposite aperture 14. Within the oblong area 24 is a capacitor formed by a pair of fingers 26, 28, interconnected at one end by a land 30, and a third finger 32 which extends between the two fingers 26, 28 from a land 34 at their free ends.

Referring to FIG. 2, on the other side of the printed circuit board 20, a rectangular copper ground plane 38 overlies the oblong opening 24 and some of the surrounding area. A plurality of plated through holes 40, arranged in two arcs, one arc on each of two opposite sides of the oblong opening 24, connect the ground plane 38 to the ground plane 22 on the underside of the board 20.

Referring also to FIG. 4, the pair of fingers 26, 28 constituting one "plate" of the capacitor, are connected via a step recovery diode 42, to ground and via an inductance 44 and a resistor 46 to a supply source. The inductance 44 also serves to receive an input from a local crystal oscillator (not shown).

The other plate of the capacitor, finger 32, is connected to ground by an inductance 48 and by a mixer diode 50 to a capacitor 52 and an inductance 54. The capacitor 52 connects to ground and the inductance 54 is connected to a low pass filter and I.F. amplifier (not shown) and to ground by a resistor 56.

The effective lengths of the fingers 26, 28, 32 are substantially one quarter wavelength at the operating frequency of the device (the frequency of the R.F. signal they are to couple). Accordingly, they serve as a resonant transmission line, so far as R.F. coupling is concerned, and as a d.c. blocking capacitor so far as the diode circuits are concerned.

Figure 5:
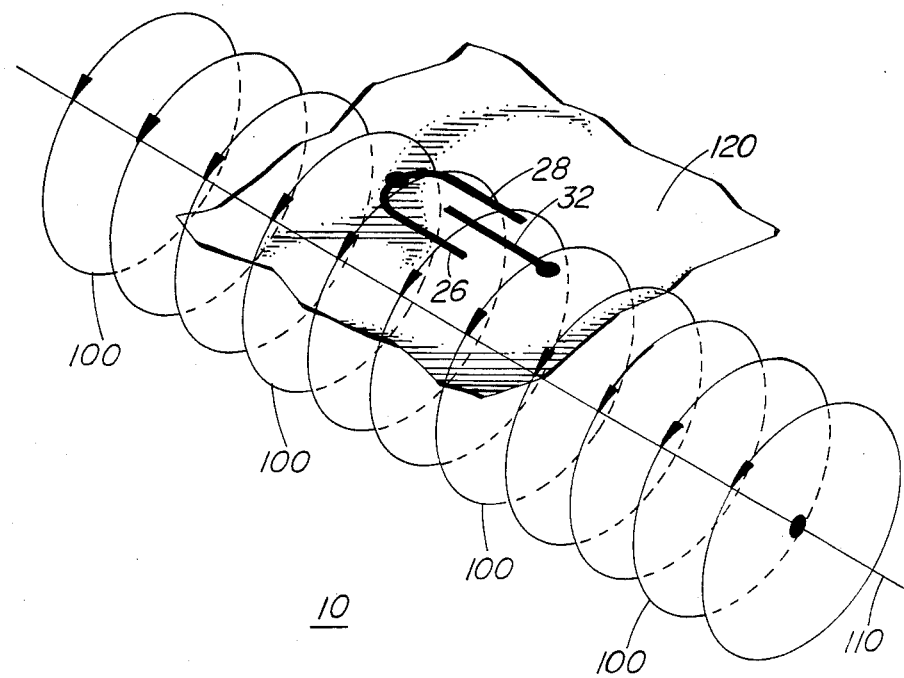
FIG. 5 is a diagrammatic view of part of the microwave device showing the configuration of representative magnetic field lines.

When the device is operating, the magnetic field in cavity 10 will be substantially cylindrical with its cylindrical axis extending parallel to the capacitor fingers as shown in FIG. 5. Representative magnetic field lines 100 in the cavity 10 define a cylinder about cylindrical axis 110. The representative magnetic field lines shown are tangential to the plane 120 defined by the conductive fingers 26, 28 and 32 which comprise the capacitor. Note that the cylindrical axis 110 is parallel to the conductive fingers 26, 28 and 32. Note further that where the magnetic field lines 100 intersect the plane 120 defined by the conductive fingers, the magnetic field lines are substantially perpendicular to the conductive fingers, so as to allow magnetic coupling of the associated radio frequency energy to the fingers. The magnetic field will couple to the capacitor and the resultant signal will be mixed and applied via the I.F. amplifier as a feedback signal to stabilize the R.F. input.

It will be appreciated that although the invention is particularly applicable to R.F. coupling of a harmonic mixer in a microwave local oscillator, it is equally applicable to other devices, for example to other mixers or to provide coupling between a waveguide and a microstrip line. Generally embodiments are applicable in frequency control applications where low cost, small size, widebanc operation and ease of manufacture are of importance.

What is claimed is:

1. Microwave apparatus comprising:
   a cavity defined by walls;
   an aperture through one wall of the cavity;
   an insulating support extending across the aperture and having a surface which faces toward the cavity and a surface which faces away from the cavity;
   a plurality of mutually spaced conductive fingers on the surface of the support which faces toward the cavity;
   a first ground plane on the surface of the support which faces toward the cavity, co-planar with, surrounding, and insulated from the conductive fingers; and a second ground plane on the surface of the support which faces away from the cavity, overlying the conductive fingers;
   wherein the conductive fingers are disposed over the aperture such that said fingers can couple magnetically with radio frequency energy in the cavity.

2. Apparatus as defined in claim 1, wherein the second ground plane is connected to the first ground plane by a plurality of plated-through holes.

3. Apparatus as defined in claim 2, wherein the plated-through holes are spaced apart from the plurality of conductive fingers in a direction generally perpendicular to said conductive fingers and arranged in two groups, the plurality of conductive fingers being between said two groups.

4. Apparatus as defined in claim 1, wherein the conductive fingers are connected to an electronic circuit so as to function as a capacitor in that circuit.

5. Apparatus as defined in claim 4, wherein the capacitor is a d.c. blocking capacitor connected between a mixer diode and a step recovery diode.

* * * * *